United States Patent
Park et al.

(10) Patent No.: US 7,881,756 B2
(45) Date of Patent: Feb. 1, 2011

(54) LEVEL SHIFTERS AND LEVEL SHIFTING METHODS FOR SUPPRESSING CURRENT FLOW AND GENERATING FIXED OUTPUT VALUES

(75) Inventors: Jin-soo Park, Yongin-si (KR); Min-su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 934 days.

(21) Appl. No.: 11/708,354

(22) Filed: Feb. 21, 2007

(65) Prior Publication Data
US 2007/0197265 A1 Aug. 23, 2007

(30) Foreign Application Priority Data
Feb. 22, 2006 (KR) .................. 10-2006-0017308

(51) Int. Cl.
*H04B 1/38* (2006.01)
*H04M 1/00* (2006.01)

(52) U.S. Cl. ............... 455/574; 455/296; 455/127.1; 455/127.5; 455/114.2; 455/572; 327/313; 327/333; 327/537; 327/316; 326/68; 326/81

(58) Field of Classification Search ............ 455/574, 455/296, 127.5, 114.2, 572; 327/537, 333, 327/313, 316; 323/907; 326/68, 81
See application file for complete search history.

(56) References Cited

U.S. PATENT DOCUMENTS

| | | | | |
|---|---|---|---|---|
| 6,097,180 A * | 8/2000 | Tsukude et al. | ............ | 323/313 |
| 6,147,540 A * | 11/2000 | Coddington | ............ | 327/333 |
| 6,191,616 B1 * | 2/2001 | Merritt et al. | ............ | 326/81 |
| 6,346,829 B1 * | 2/2002 | Coddington | ............ | 326/81 |
| 6,351,173 B1 * | 2/2002 | Ovens et al. | ............ | 327/333 |
| 6,501,306 B1 * | 12/2002 | Kim et al. | ............ | 327/112 |
| 6,600,358 B1 * | 7/2003 | Chan | ............ | 327/333 |
| 6,605,963 B2 * | 8/2003 | Kitamoto et al. | ............ | 326/81 |
| 6,661,274 B1 * | 12/2003 | Naka et al. | ............ | 327/333 |
| 6,683,486 B2 * | 1/2004 | Hanson et al. | ............ | 327/333 |

(Continued)

FOREIGN PATENT DOCUMENTS

JP 06-224736 8/1994

(Continued)

OTHER PUBLICATIONS

Korean Office Action (dated May 30, 2008) for counterpart Korean Patent Application No. 10-2006-0017308 is provided for the purposes of certification under 37 C.F.R. §§ 1.97(e).

*Primary Examiner*—Marceau Milord
(74) *Attorney, Agent, or Firm*—Harness, Dickey & Pierce, P.L.C.

(57) ABSTRACT

A level shifter includes a level shifting circuit which receives input signal from a function block and changes the voltage level of the input signal, to output an output signal; a current blocking circuit, which suppresses current flowing to the level shifting circuit in an input suppression mode in which power supplied to the function block is cut and deactivates the level shifting circuit; and an output control circuit, which controls the output signal of the level shifting circuit to have a direct current (DC) voltage level in the input suppression mode.

25 Claims, 9 Drawing Sheets

U.S. PATENT DOCUMENTS

| | | | |
|---|---|---|---|
| 6,768,368 B2 * | 7/2004 | Kaneko et al. | 326/81 |
| 6,774,695 B2 * | 8/2004 | Hayashi et al. | 327/333 |
| 6,917,236 B2 * | 7/2005 | Doutreloigne et al. | 327/333 |
| 7,110,740 B2 * | 9/2006 | Miyashita | 455/326 |
| 7,145,383 B2 * | 12/2006 | Mizuno et al. | 327/546 |
| 7,148,735 B2 * | 12/2006 | Ito et al. | 327/333 |
| 7,199,617 B1 * | 4/2007 | Schrom et al. | 326/86 |
| 7,230,475 B2 * | 6/2007 | Choi et al. | 327/544 |
| 7,248,243 B2 * | 7/2007 | Murakami et al. | 345/98 |
| 7,323,924 B2 * | 1/2008 | Osame et al. | 327/333 |
| 7,358,789 B2 * | 4/2008 | Kimura | 327/333 |
| 7,456,680 B2 * | 11/2008 | Gyohten et al. | 327/540 |
| 7,466,184 B2 * | 12/2008 | Ricard et al. | 327/333 |
| 7,492,206 B2 * | 2/2009 | Park et al. | 327/333 |
| 7,570,525 B2 * | 8/2009 | Nii et al. | 365/189.11 |
| 2006/0232320 A1 * | 10/2006 | Seki et al. | 327/333 |
| 2006/0290405 A1 * | 12/2006 | Kim et al. | 327/333 |

FOREIGN PATENT DOCUMENTS

| | | |
|---|---|---|
| JP | 07-086904 | 3/1995 |
| JP | 2004-343396 | 12/2004 |
| JP | 2005-033718 | 2/2005 |
| KR | 1020040008517 A | 1/2004 |
| KR | 1020040093894 A | 11/2004 |
| KR | 10-2005-0054536 | 6/2005 |

* cited by examiner

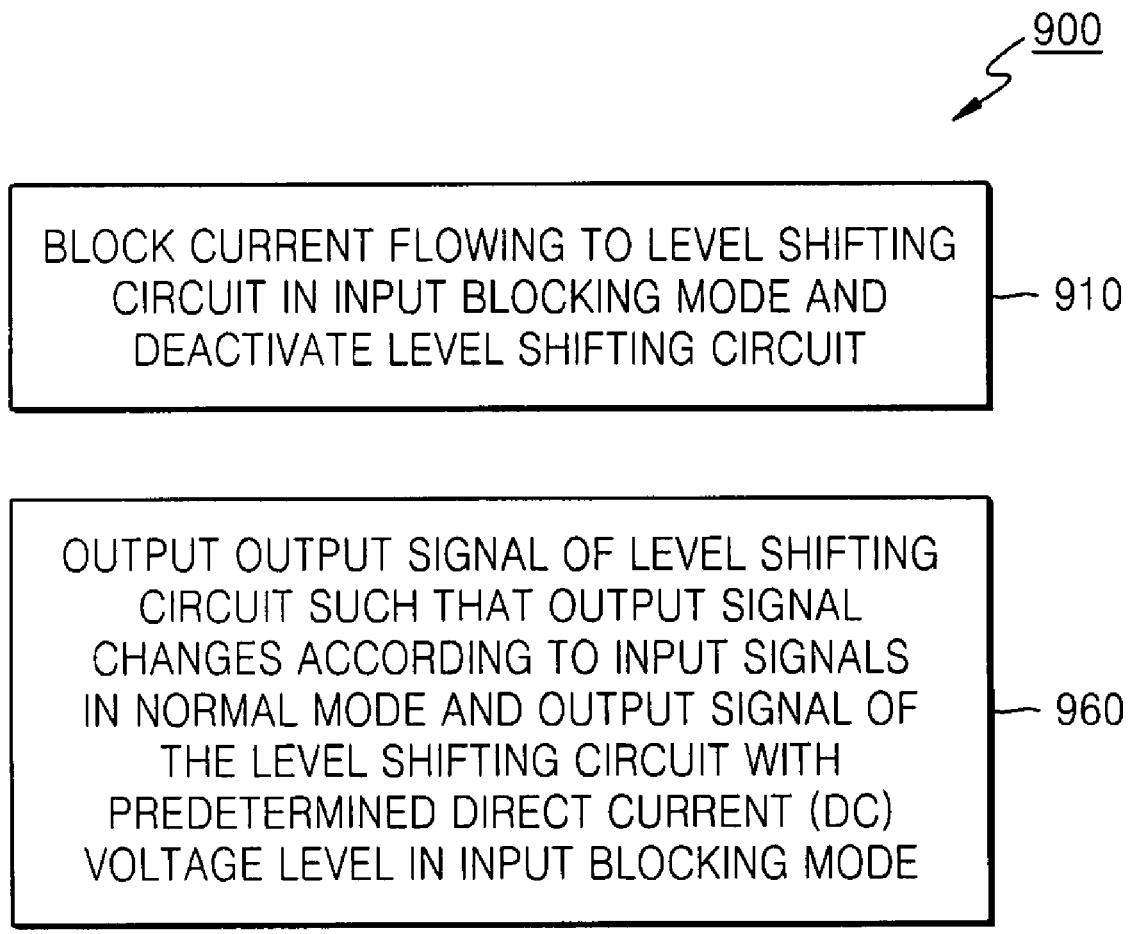

LEVEL SHIFTERS AND LEVEL SHIFTING METHODS FOR SUPPRESSING CURRENT FLOW AND GENERATING FIXED OUTPUT VALUES

PRIORITY STATEMENT

This non-provisional U.S. patent application claims priority under 35 U.S.C. §119 to Korean Patent Application No. 10-2006-0017308, filed on Feb. 22, 2006, in the Korean Intellectual Property Office (KIPO), the entire contents of which are incorporated herein by reference.

BACKGROUND

Description of the Related Art

Due to increased demand for mobile devices, the mobile market is gradually becoming larger. It is important for mobile devices to maintain an appropriate degree of performance for a long period of time using a battery with limited capacity.

Various conventional methods for reducing power consumption are used when designing mobile devices. One conventional method uses voltages having different levels corresponding to respective function blocks included in the mobile device. For example, a relatively high voltage is applied to function blocks performing a relatively high-performance operation such as processing data at a high speed, and a relatively low voltage is applied to function blocks that perform a simpler and/or lower-performance operation that does not require high-speed processing. When different voltage levels are used in different function blocks, a level shifter is conventionally used to connect the function blocks. To reduce power consumption, power applied to the function blocks and level shifters may be blocked when the function blocks and level shifters are not in use. In this example, output terminals of the function blocks and the level shifters to which power is not supplied may enter a high impedance state or a meta-stable state.

In a high impedance state, the output signals of the output terminals are not fixed to specific values, but vary randomly. If any output terminal of the function blocks and the level shifters is in the high impedance state, other function blocks and level shifters that receive the output signals may not operate normally.

In a meta-stable state, the output signals of the output terminals have arbitrary voltage levels existing between a voltage level corresponding to a logic high state and a voltage level corresponding to a logic low state. If any output terminal of the function blocks and the level shifters is in the meta-stable state, output signals with arbitrary voltage levels are generated, and relatively excessive current may abruptly flow in the level shifter that receives the output signals. This may increase power consumption of the level shifter.

SUMMARY

Example embodiments relate to level shifters and level shifting methods, for example, a level shifter and level shifting method for suppressing and/or preventing current flow and/or generating fixed output values in an input suppression mode.

At least one example embodiment provides a level shifter in which current may not flow and fixed output values may be generated in an input suppression mode.

At least one other example embodiment provides a level shifting method for suppressing and/or preventing current flow and/or generating fixed output values in an input suppression mode.

According to at least one example embodiment, a level shifter may include a level shifting circuit, a current suppression circuit and an output control circuit. The level shifting circuit may receive input signals from a function block and change the voltage level of the input signal, so as to output such signals as an output signal. The current blocking circuit may cut the current flowing to the level shifting circuit in an input suppression mode where power supplied to the function block may be cut and deactivate the level shifting circuit. The output control unit may control the output signal of the level shifting circuit to have a direct current (DC) voltage level in the input suppression mode.

According to at least some example embodiments, the output control circuit may connect the output terminal of the level shifting circuit with a power supply voltage or ground voltage in the input suppression mode. The output control circuit may be a MOS transistor. The MOS transistor may include a gate receiving a mode selection signal, a first terminal connected to the output terminal of the level shifting circuit, and a second terminal connected to a power supply voltage or ground voltage. The MOS transistor may respond to the mode selection signal in the input suppression mode, and may be turned on such that the output terminal of the level shifting circuit is connected to a power supply voltage or ground voltage.

According to at least some example embodiments, the level shifting circuit may include a latching unit and a level shifting unit. The latching unit may latch the input signal to be output, and the level shifting unit may change the voltage level of the signals of the latching unit and output the output signal. The current blocking circuit may include a first current suppression circuit and a second current suppression circuit. The first current suppression unit may block the current flowing to the latching unit in the input suppression mode, and the second current suppression circuit may block the current flowing to the level shifting unit in the input suppression mode. The first current suppression circuit may be a MOS transistor. The MOS transistor may include a gate receiving an inversion mode selection signal generated by inverting the mode selection signal, a first terminal connected to the latching unit, and a second terminal connected to a ground terminal. The MOS transistor may respond to the inverted mode selection signal in the input suppression mode and turned off, such that current does not flow to the latching unit.

According to at least some example embodiments, the MOS transistor may include a gate receiving the mode selection signal or the inversion mode selection signal generated by inverting the mode selection signal, a first terminal connected to the latching unit, and a second terminal connected to the ground voltage or a power supply voltage. The MOS transistor may respond to the mode selection signal or the inversion mode selection signal in the input suppression mode and may be turned on such that the latching unit may be connected to the ground voltage or a power supply voltage. The mode selection signal may be a signal indicating one of a normal mode and the input suppression mode which generates the output signal changed according to the input signal. According to at least some example embodiments, the input signals may be two input signals having opposite phases.

At least one other example embodiment provides a level shifting method in which an input signal may be received from a function block, the voltage levels of the input signal may be changed, and a signal generated based on the input signal may be output as an output signal. In at least this example embodiment, the current flowing to a level shifting circuit may be suppressed and/or blocked in an input suppression mode where the power supplied to the function block is cut to deactivate the level shifting circuit. The output signal of the level shifting circuit may be output such that the output signal changes according to the input signal in a normal mode, and may be output with a direct current (DC) voltage level in the input suppression mode.

At least one other example embodiment provides a level shifter. According to at least this example embodiment, the level shifter may include a level shifting circuit, a current suppression circuit and an output circuit. The level shifting circuit may be configured to generate an output signal by changing a voltage level of an input signal received from a function block. The current suppression circuit may be configured to deactivate the level shifting circuit in response to a mode selection signal. The output control circuit may be configured to control the output signal from the level shifting circuit to have a first direct current (DC) voltage level.

According to at least some example embodiments, the current suppression circuit may deactivate the level shifting circuit by suppressing current flowing to the level shifting circuit in an input suppression mode in which power supplied to the function block is cut. The output control circuit may control the output signal from the level shifting circuit to have a first direct current (DC) voltage level in the input suppression mode. The output control circuit may connect the output terminal of the level shifting circuit to a power supply voltage or ground voltage in the input suppression mode. The output control circuit may include a gate configured to receive a mode selection signal, a first terminal connected to an output terminal of the level shifting circuit, and a second terminal connected to a first voltage. In the input suppression mode, the output control circuit may connect the output terminal of the level shifting circuit with the first voltage in response to the mode selection signal. The first voltage may be one of a power supply voltage or a ground voltage.

According to at least some example embodiments, the level shifting circuit may include a latching circuit configured to latch the input signal, and a level shifting circuit configured to change the voltage level of the signals of the latching circuit and output the output signal. The current blocking circuit may include a first current suppression circuit configured to suppress current flowing to the latching circuit in the input suppression mode, and a second current suppression circuit configured to suppress current flowing to the level shifting circuit in the input suppression mode.

According to at least some example embodiments, the first current suppression circuit may include a gate configured to receive an inversion mode selection signal generated by inverting the mode selection signal, a first terminal connected to the latching circuit, and a second terminal connected to a ground terminal. In the input suppression mode, the first current suppression circuit may stop, suppress or block current from flowing to the latching circuit in response to the inverted mode selection signal. The second current suppression circuit may include a gate configured to receive the mode selection signal or the inversion mode selection signal generated by inverting the mode selection signal, and a first terminal connected to the level shifting circuit. In the input suppression mode, the second current suppression circuit may stop, suppress or block current from flowing to the level shifting circuit in response to the mode selection signal or the inversion mode selection signal.

In at least some other example embodiments, the second current suppression circuit may include a gate configured to receive the mode selection signal or the inversion mode selection signal generated by inverting the mode selection signal, a first terminal connected to the latching circuit, and a second terminal connected to a first voltage, the first voltage being one of a ground voltage or a power supply voltage. In the input suppression mode, the second current suppression circuit may connect the latching circuit to the first voltage response to the mode selection signal or the inversion mode selection signal. The mode selection signal may be indicative of one of a normal mode and the input suppression mode, and the output may be generated according to the mode selection signal.

According to at least some example embodiments, the level shifting circuit may include a latching circuit configured to receive, latch and output the input signal, and a level shifting unit configured to change the voltage level of the output signal of the latching circuit and output the changed signal as the output signal. The current suppression circuit may include a first current suppression unit configured to suppress current flowing to the latching circuit in response to the mode selection signal, and a second current suppression unit configured to suppress current flowing to the level shifting circuit in response to the mode selection signal.

According to at least some example embodiments, the latching circuit may include a first transistor having a gate connected to a second node, a first terminal connected to a first power supply voltage, and a second terminal connected to a first node, a second transistor having a gate connected to the first node, a first terminal connected to a second power supply voltage, and a second terminal connected to the second node, a third transistor having a gate configured to receive the input signal and a first terminal connected to the first node, and a fourth transistor having a gate configured to receive an inverted input signal generated by inverting the input signal and a first terminal connected to the second node. The level shifting circuit may include a fifth transistor having a gate connected to the gate of the second transistor and a second terminal connected to an output node, and a sixth transistor having a gate connected to the gate of the fourth transistor and a first terminal connected to the output node.

According to at least some example embodiments, the first current suppression circuit may include a seventh transistor in which a gate may be configured to receive an inversion mode selection signal generated by inverting the mode selection signal, a first terminal may be connected to the second terminal of the third transistor and the second terminal of the fourth transistor, and a second terminal may be connected to a ground voltage. The output control circuit may include an eighth transistor in which a gate may be configured to receive the mode selection signal, a first terminal may be connected to the output node, and a second terminal may be connected to a ground voltage.

The second current suppression circuit may include a ninth transistor in which a gate may be configured to receive the mode selection signal, a first terminal may be connected to a third power supply voltage, and a second terminal may be connected to the first terminal of the fifth transistor. The ninth transistor may stop, block or suppress current passing between the fifth and sixth transistor in response to the mode selection signal.

Alternatively, the first current suppression circuit may include a seventh transistor in which a gate may be configured to receive an inversion mode selection signal generated by inverting the mode selection signal, a first terminal may be connected to the second terminal of the third transistor and the second terminal of the fourth transistor, and a second terminal may be connected to a ground voltage. The output control circuit may include an eighth transistor in which a gate may be configured to receive the mode selection signal, a first terminal may be connected to the output node, and a second terminal may be connected to a ground voltage. The second current suppression circuit may include a ninth transistor in which a gate may be configured to receive the inversion mode selection signal, a first terminal may be connected to a fourth power supply voltage, and a second terminal is connected to the first node. The ninth transistor may turn on in response to the inversion mode signal such that the first node has the voltage level of the fourth power supply voltage.

Alternatively, the first current suppression circuit may include a seventh transistor in which a gate may be configured to receive an inversion mode selection signal generated by inverting the mode selection signal, a first terminal may be connected to the second terminal of the third transistor, and a second terminal may be connected to a ground voltage. The output control circuit may include an eighth transistor in which a gate may be configured to receive the mode selection signal, a first terminal may be connected to the output node, and a second terminal may be connected to a ground voltage. The second current suppression circuit may include a ninth transistor in which a gate may be configured to receive the inversion mode selection signal, a first terminal may be connected to the fourth power supply voltage, and a second terminal may be connected to the first node. The ninth transistor may turn on in response to the inversion mode selection signal such that the first node has the voltage level of the fourth power supply voltage.

According to at least some example embodiments, the first current suppression circuit may include a seventh transistor in which a gate may be configured to receive an inversion mode selection signal generated by inverting the mode selection signal, a first terminal may be connected to the second terminal of the third transistor, and a second terminal may be connected to a ground voltage. The output control circuit may include an eighth transistor in which a gate may be configured to receive the mode selection signal, a first terminal may be connected to the output node, and a second terminal may be connected to a ground voltage. The second current suppression circuit may include a tenth transistor in which a gate may be configured to receive the mode selection signal, a first terminal may be connected to the second node, and a second terminal may be connected to a ground voltage. The tenth transistor may turn on in response to the mode selection signal such that the second node has a voltage level of the ground voltage.

Alternatively, the first current suppression circuit may include a seventh transistor in which a gate may be configured to receive an inversion mode selection signal generated by inverting the mode selection signal, a first terminal may be connected to the second terminal of the third transistor and the second terminal of the fourth transistor, and a second terminal may be connected to a ground voltage. The output control circuit may include an eighth transistor in which a gate may be configured to receive the mode selection signal, a first terminal may be connected to the output node, and a second terminal may be connected to a ground voltage. The second current suppression circuit may include a tenth transistor in which a gate may be configured to receive the mode selection signal, a first terminal may be connected to the second node, and a second terminal may be connected to a ground voltage, wherein the tenth transistor may turn on in response to the mode selection signal such that the second node has the voltage level of the ground voltage.

According to at least some example embodiments, the first current suppression circuit may include a seventh transistor in which a gate may be configured to receive an inversion mode selection signal generated by inverting the mode selection signal, a first terminal may be connected to the second terminal of the third transistor and the second terminal of the fourth transistor, and a second terminal may be connected to a ground voltage. The output control circuit may include a ninth transistor in which a gate may be configured to receive the mode selection signal, a first terminal may be connected to the fourth power supply voltage, and a second terminal may be connected to the output node. The second current suppression circuit may include an eighth transistor in which a gate may be configured to receive an inversion mode selection signal generated by inverting the mode selection signal, a first terminal may be connected to the second terminal of the sixth transistor, and a second terminal may be connected to a ground voltage. The eighth transistor may turn off in response to the inversion mode selection signal such that the current passing between the fifth transistor and the sixth transistor is suppressed.

Alternatively, the first current suppression circuit may include a seventh transistor in which a gate may be configured to receive an inversion mode selection signal generated by inverting the mode selection signal, a first terminal may be connected to the second terminal of the third transistor, and a second terminal may be connected to a ground voltage. The output control circuit may include an eighth transistor in which a gate may be configured to receive the mode selection signal, a first terminal may be connected to the first node, and a second terminal may be connected to a ground voltage. The eighth transistor may turn on in response to the mode selection signal such that the first node has the voltage level of the ground voltage. The second current suppression circuit may include a tenth transistor in which a gate may be configured to receive the inversion mode selection signal, a first terminal may be connected to the second terminal of the sixth transistor, and a second terminal may be connected to a ground voltage. The tenth transistor may turn off in response to the inversion mode selection signal such that the current passing between the fifth transistor and the sixth transistor is suppressed.

At least one other example embodiment provides a level shifting method. According to at least this example embodiment, a level shifting circuit may be deactivated by suppressing current flowing to the level shifting circuit in an input suppression mode in which power supplied to a function block is cut; and an output signal may be output from the level shifting circuit. The output signal may change according to the input signal in a normal mode, and may have a first direct current (DC) voltage level in the input suppression mode. The output signal may be output with a first DC voltage level by connecting an output terminal of the level shifting circuit with one of a power supply voltage and a ground voltage.

According to at least some example embodiments, the method may further include latching the input signal, and changing the voltage level of the input signal to generate the output signal. The level shifting circuit may be deactivated by blocking current flowing to a latching circuit and the level shifting circuit in the input suppression mode.

BRIEF DESCRIPTION OF THE DRAWINGS

The present invention will become more apparent by describing in detail example embodiments thereof with reference to the attached drawings in which:

FIG. 9 is a flowchart illustrating a level shifting method according to an example embodiment.

DETAILED DESCRIPTION OF EXAMPLE EMBODIMENTS

Figure 1:
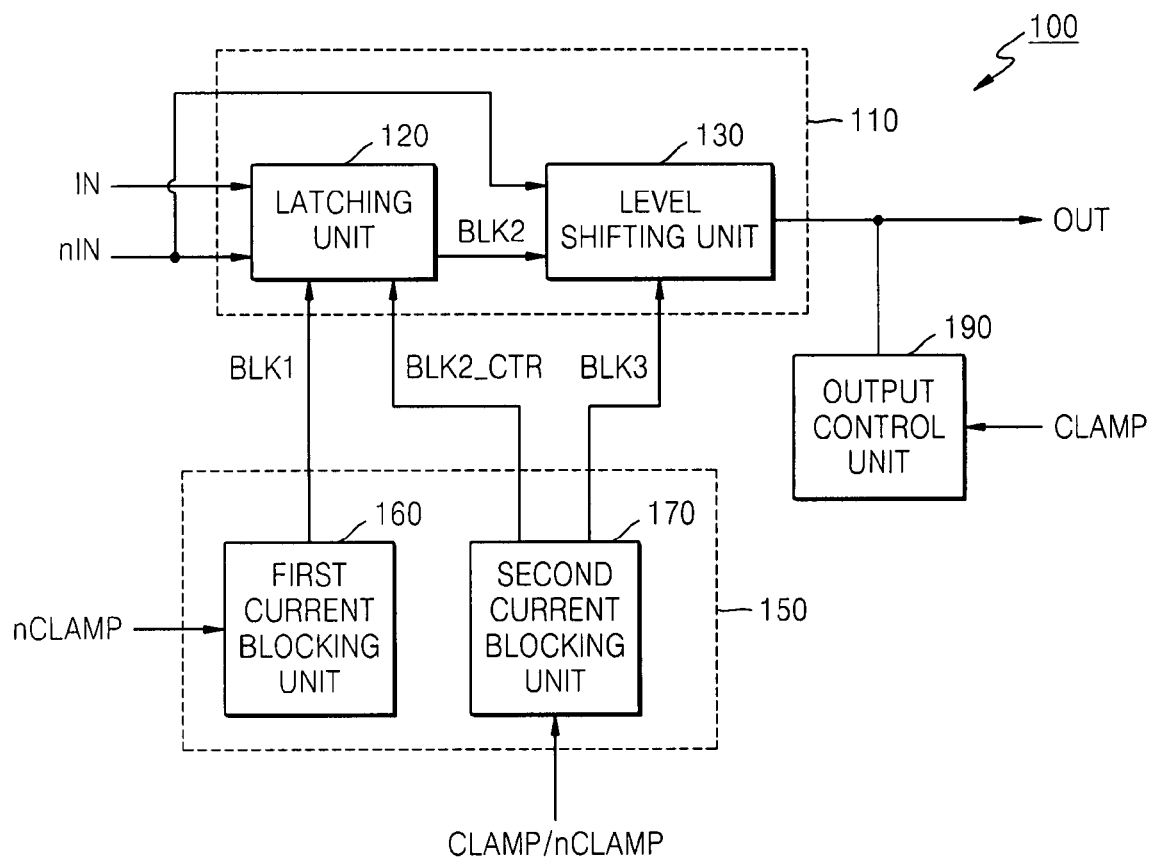
FIG. 1 is a block diagram of a level shifter according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a level shifter according to an example embodiment. According to at least this example embodiment, current may not flow and/or fixed output values may be generated in an input suppression mode (or, alternatively referred to as an input blocking mode).

Referring to FIG. 1, a level shifter 100 may include a level shifting unit (or circuit) 110, a current blocking unit (or current suppression circuit) 150 and/or an output control unit (or circuit) 190.

The level shifting circuit 110 may receive at least one of input signals IN and nIN from a function block (not shown) and may change the voltage level of the at least one input signals IN and nIN to generate and output, for example, output signal OUT.

In an input blocking mode, power supplied to function blocks (not shown), which output the input signals IN and nIN to the level shifting circuit 110, may be suppressed (or inhibited, blocked, cut or interrupted). On the other hand, in a normal mode, power may be supplied to the function block (not shown) and the function block may operate normally.

The current blocking unit 150 may suppress (or inhibit, block, cut, interrupt, etc.) the current flowing to the level shifting circuit 110 in the input suppression mode. Accordingly, the current blocking unit 150 may deactivate the level shifting circuit 110. In the normal mode, the current blocking unit 150 may not deactivate the level shifting circuit 110.

The output control unit 190 may control the output signal OUT of the level shifting circuit 110 so that the output signal OUT has a desired or given direct current (DC) voltage level in the input suppression mode. The DC voltage level may be a desired or given power supply voltage or ground voltage. On the other hand, in the normal mode, the output control unit 190 may not affect the output signal OUT of the level shifting circuit 110. In at least one example embodiment, the output control unit 190 may selectively control the output signal based on whether the function block is in an input suppression mode or a normal mode.

Referring still to FIG. 1, the level shifting circuit 110 may include a latching unit (or circuit) 120 and a level shifting circuit (or unit) 130. The latching unit 120 may latch the input signals IN and nIN and output the input signals IN and nIN. The level shifting circuit 130 may change the voltage levels of the signals output from the latching unit 120 to output the output signal OUT.

The current blocking unit 150 may include a first current blocking unit 160 (or alternatively referred to as a first current suppression circuit 160) and a second current blocking unit 170 (or alternatively referred to as a second current suppression circuit 170). The first current blocking circuit 160 may suppress and/or block current flow to the latching unit 120 in response to an inversion mode selection signal nCLAMP. The inversion mode signal nCLAMP may be an inverted version of the mode selection signal CLAMP. The second current blocking circuit 170 may suppress and/or block the current flow to the level shifting circuit 130 in response to the mode selection signal CLAMP or the inversion mode selection signal nCLAMP.

The output control unit 190 may connect the output terminal of the level shifting unit 130 with a power supply voltage or ground voltage in response to the mode selection signal CLAMP.

The mode selection signal CLAMP may indicate one of the normal mode and the input blocking mode. The mode indicated by the mode selection signal CLAMP may be determined based on the voltage level of the mode selection signal CLAMP. For example, the mode indicated by the mode selection signal CLAMP may be determined from the mode selection signal CLAMP because the voltage level of the mode selection signal CLAMP indicating the normal mode and the voltage level of the mode selection signal CLAMP indicating the input blocking mode may be different. An inversion mode selection signal nCLAMP may be obtained by inverting the mode selection signal CLAMP.

The level shifter 100 may output an output signal with a fixed, given or desired voltage level regardless of an input signal received from a function block in an input blocking mode where power supplied to the function block is suppressed. Therefore, other function blocks operated using the output signal of the level shifter 100 may operate normally even in the input blocking mode. In addition, because the level shifter 100 suppresses and/or blocks the current passing in the input blocking mode, power consumption (e.g., excessive power consumption) may be reduced and/or prevented.

Figure 2:
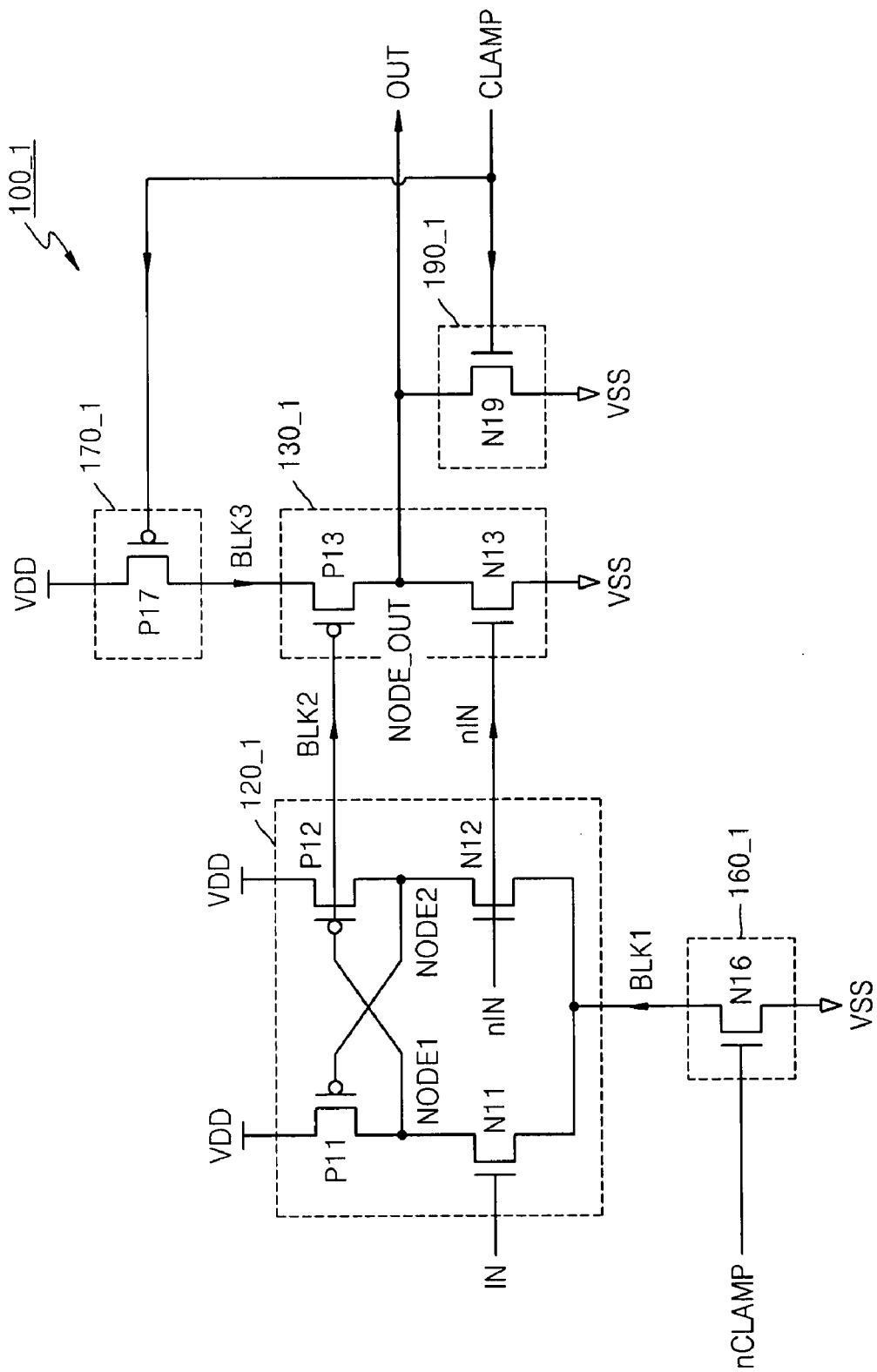
FIG. 2 is a circuit diagram of the level shifter according to another example embodiment.

FIG. 2 is a circuit diagram of a level shifter according to an example embodiment.

Referring to FIG. 2, a level shifter 100_1 may include a latching unit (or circuit) 120_1, a level shifting unit (or circuit) _1, a first current blocking unit (or circuit) 160_1 (or alternatively first current suppression unit or circuit 160_1), a second current blocking unit (or circuit) 170_1 (or alternatively second current suppression unit or circuit 170_1), and an output control unit (or circuit) 190_1.

The latching unit 120_1 may include a plurality of transistors. For example, the latching unit 120_1 may include a first PMOS transistor P11, a second PMOS transistor P12, a first NMOS transistor N11, and a second NMOS transistor N12. The level shifting unit 130_1 may also include a plurality of transistors. For example, the level shifting unit 130_1 may include a third PMOS transistor P13 and a third NMOS transistor N13. The latching unit 120_1 and the level shifting unit 130_1 may change the voltage levels of the input signals IN and nIN and the level shifting unit 130_1 may output a signal generated based on the input signals IN and nIN as the output signal OUT. Operations of the latching unit 120_1 and the level shifting unit 130_1 are well-known, and thus, a detailed description thereof is omitted for the sake of brevity.

The first current blocking unit 160_1 may include a transistor (e.g., a fourth NMOS transistor) N16. The gate of the fourth NMOS transistor N16 may receive the inversion mode selection signal nCLAMP, the first terminal of the fourth NMOS transistor N16 may be connected to the second terminals of the first NMOS transistor N11 and the NMOS transistor N12, respectively, and the second terminal of the fourth NMOS transistor N16 may be connected to a ground voltage VSS. The second current blocking unit 170_1 may include a transistor (e.g., a fourth PMOS transistor) P17. The gate of the fourth PMOS transistor P17 may receive the mode selection signal CLAMP, the first terminal of the fourth PMOS transistor P17 may be connected to a third power supply voltage VDD, and a second terminal of the fourth PMOS transistor P17 may be connected to the first terminal of the third PMOS transistor P13. The output control unit 190_1 may include a transistor (e.g., a fifth NMOS transistor) N19. The gate of the fifth NMOS transistor N19 may receive the mode selection signal CLAMP, the first terminal of the fifth NMOS transistor N19 may be connected to an output node NODE_OUT, and the second terminal of the fifth NMOS transistor N19 may be connected to the ground voltage VSS.

In the normal mode, the mode selection signal CLAMP with a logic low level and the inversion mode selection signal nCLAMP with a logic high level may be applied. In this example, the fourth NMOS transistor N16 and the fourth PMOS transistor P17 may be turned on, and the fifth NMOS transistor N19 may be turned off. The fourth NMOS transistor N16, the fifth NMOS transistor N19, and the fourth PMOS transistor P17 may not effect the latching unit 120_1 or the level shifting unit 130_1. Therefore, in the normal mode, the latching unit 120_1 and the level shifting unit 130_1 may change the voltage levels of the input signals IN and nIN, and the level shifting unit 130_1 may output output signal OUT generated or obtained based on the input signals IN and nIN.

In the input blocking mode, the mode selection signal CLAMP with a logic high level and the inversion mode selection signal nCLAMP with a logic low level may be applied. In this example, the fourth NMOS transistor N16 and the fourth PMOS transistor P17 may be turned off, whereas the fifth NMOS transistor N19 may be turned on. When the fourth NMOS transistor N16 is turned off, current flow between the first PMOS transistor P11 and the first NMOS transistor N11 and the current flow between the second PMOS transistor P12 and the second NMOS transistor N12 may be suppressed and/or blocked. Thus, in the input blocking mode, current may not flow through the latching unit 120_1. When the fourth PMOS transistor P17 is turned off, current passing between the third PMOS transistor P13 and the third NMOS transistor N13 may be suppressed and/or blocked. Thus, in the input blocking mode, current may not flow through the level shifting unit 130_1. When the fifth NMOS transistor N19 is turned on, the output node NODE_OUT may be connected to the ground voltage VSS. Thus, in the input blocking mode, the output signal OUT with a level of the ground voltage VSS, which may be a logic low level, may be output regardless of the level of the output signals IN and nIN.

Figure 3:
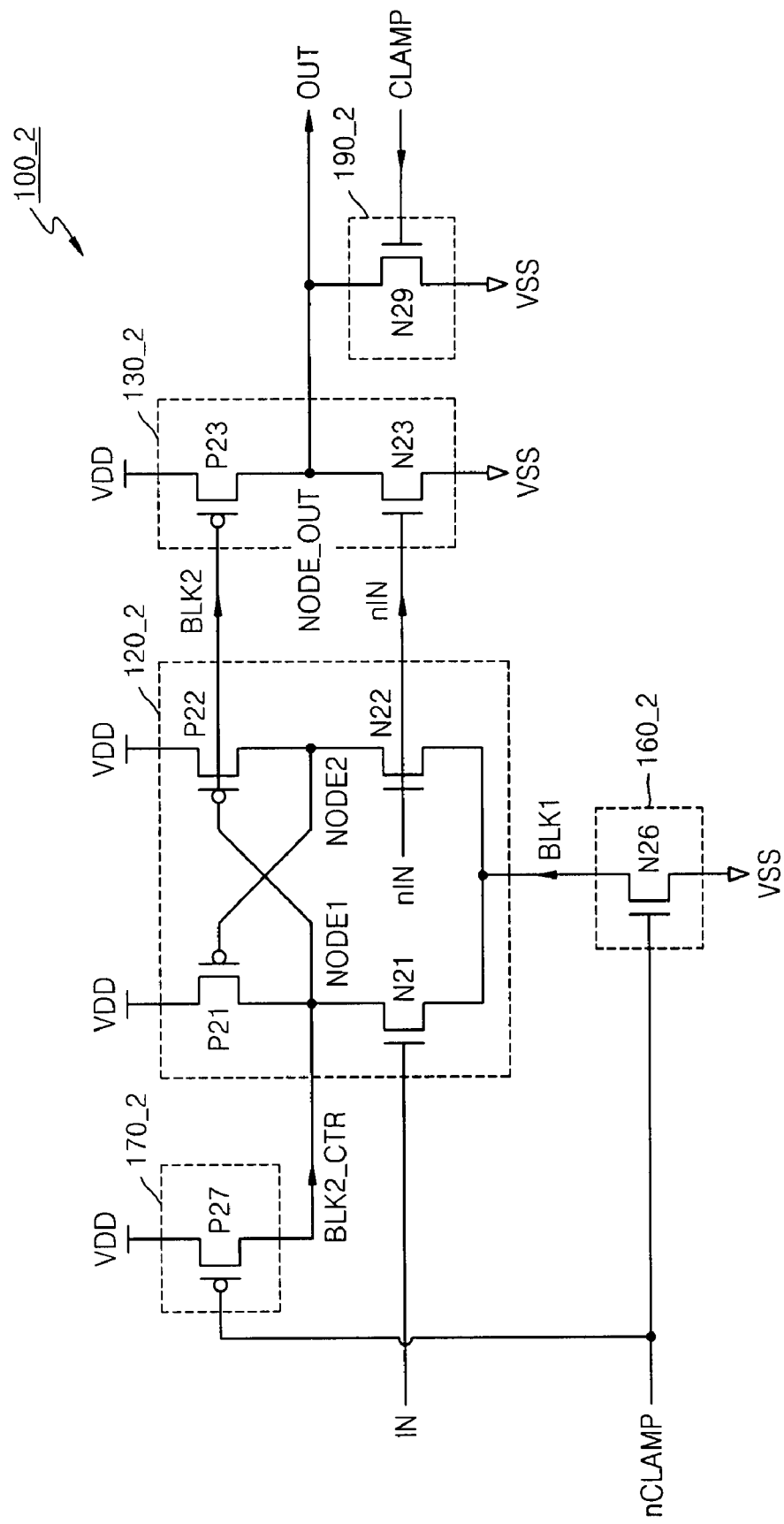
FIG. 3 is a circuit diagram of a level shifter according to another example embodiment.

FIG. 3 is a circuit diagram of a level shifter according to another example embodiment.

Referring to FIG. 3, a level shifter 100_2 may have the same or substantially the same configuration and/or operation as the level shifter 100_1 described above with regard to FIG. 2, except that the level shifter 100_2 may include a second current blocking unit 170_2 instead of the second current blocking unit 170_1 as in FIG. 2. Therefore, for the sake of brevity, only second current blocking unit 170_2 will be described.

The second current blocking unit 170_2 may include a fourth PMOS transistor P27. The gate of the fourth PMOS transistor P27 may receive the inversion mode selection signal nCLAMP, the first terminal of the fourth PMOS transistor P27 may be connected to a fourth power supply voltage VDD, and the second terminal of the fourth PMOS transistor P27 may be connected to a first node NODE1.

In the input blocking mode, the fourth PMOS transistor P27 may be turned on in response to the inversion mode selection signal nCLAMP with a logic low level. In this example, the first node NODE1 may have the voltage level of the fourth power supply voltage VDD, for example, a logic high level. When the first node NODE1 has a logic high level, a third PMOS transistor P23 of a level shifting unit 130_2 may be turned off. Consequently, current passing between the third PMOS transistor P23 and a third NMOS transistor N23 may be suppressed and/or blocked. Thus, in the input blocking mode, current may not flow through the level shifting unit 130_2.

In the normal mode, the fourth PMOS transistor P27 may be turned off in response the inversion mode selection signal nCLAMP with a logic high level. In this example, the first node NODE1 may not be effected. In addition, a latching unit 120_2 and the level shifting unit 130_2 may perform level shifting (e.g., general level shifting), which may change the voltage level of the output signal OUT according to the voltage level of the input signals IN and nIN, and the level shifting unit 130_2 may output the output signal OUT.

Figure 4:
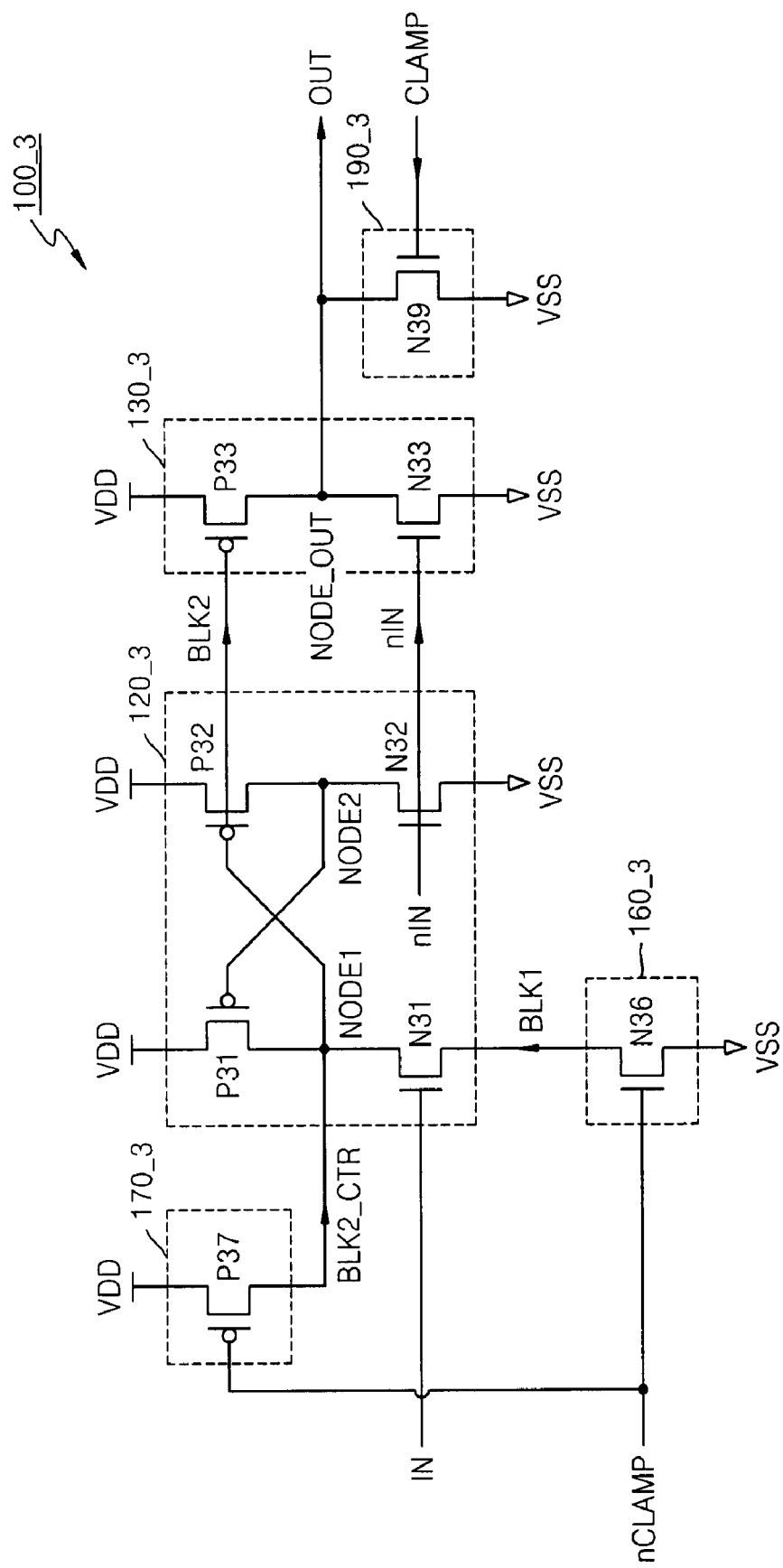
FIG. 4 is a circuit diagram of a level shifter according to another example embodiment.

FIG. 4 is a circuit diagram of a level shifter according to another example embodiment.

Referring to FIG. 4, a level shifter 100_3 may have the same or substantially the same configuration and/or operation as the level shifter 100_2 described above, except that the first current blocking unit 160_3 may not be connected to a second PMOS transistor P32 and a second NMOS transistor N32. As shown in FIG. 4, the first current blocking unit 160_3 may include a fourth NMOS transistor N36. The gate of the fourth NMOS transistor N36 may receive the inversion mode selection signal nCLAMP, the first terminal may be connected to the second terminal of the first NMOS transistor N31, and the second terminal may be connected to ground voltage VSS. For the sake of brevity, the configuration and operations of the level shifter 100_3 will be described focusing on differences with the level shifter 100_2.

In the input blocking mode, a fourth NMOS transistor N36 of the first current blocking unit 160_3 may be turned off in response to the inversion mode selection signal nCLAMP with a logic low level. When the fourth NMOS transistor N36 is turned off, current passing between a first PMOS transistor P31 and a first NMOS transistor N31 may be suppressed and/or blocked. Thus, in the input blocking mode, the current may not flow through a latching unit 120_3.

Figure 5:
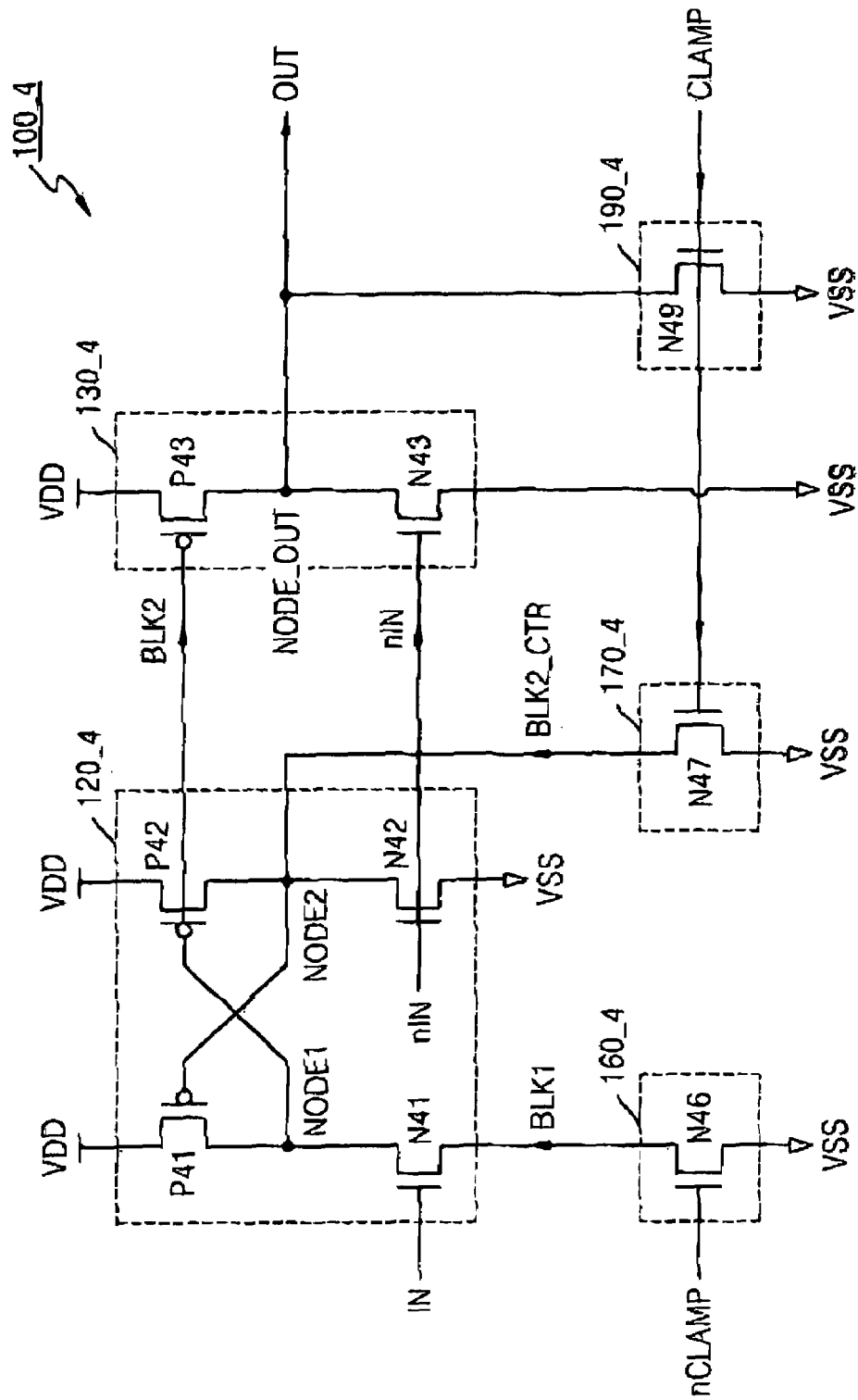
FIG. 5 is a circuit diagram of a level shifter according to another example embodiment.

FIG. 5 is a circuit diagram of a level shifter according to yet another example embodiment.

Referring to FIG. 5, a level shifter 100_4 may have the same or substantially the same configuration and/or operation as the level shifter 100_3 described above, except that the level shifter 100_4 may include a second current blocking unit 170_4 connected to the latching unit 120_4 and the output control unit 190_4. Therefore, only the second current blocking unit 170_4 will be described for the sake of brevity.

The second current blocking unit 170_4 may include a sixth NMOS transistor N47. The gate of the sixth NMOS transistor N47 may receive the mode selection signal CLAMP, the first terminal of the sixth NMOS transistor N47 may be connected to a second node NODE2, and the second terminal of the sixth NMOS transistor N47 may be connected to the ground voltage VSS.

In the input blocking mode, the sixth NMOS transistor N47 may be turned on in response the mode selection signal CLAMP with a logic high level. Thus, the second node NODE2 may have the voltage level of the ground voltage VSS, for example, a logic low level. When the second node NODE2 has a logic low level, a first PMOS transistor P41 of a latching unit 120_4 may be turned on. In addition, a first node NODE1 may have the voltage level of a first power supply voltage VDD, for example, a logic high level. When the first node NODE1 has a logic high level, a third PMOS transistor P43 of a level shifting unit 130_4 may be turned off. Thus, current passing between the third PMOS transistor P43 and a third NMOS transistor N43 may be suppressed and/or blocked. Therefore, in the input blocking mode, the current may not flow through the level shifting unit 130_4.

Figure 6:
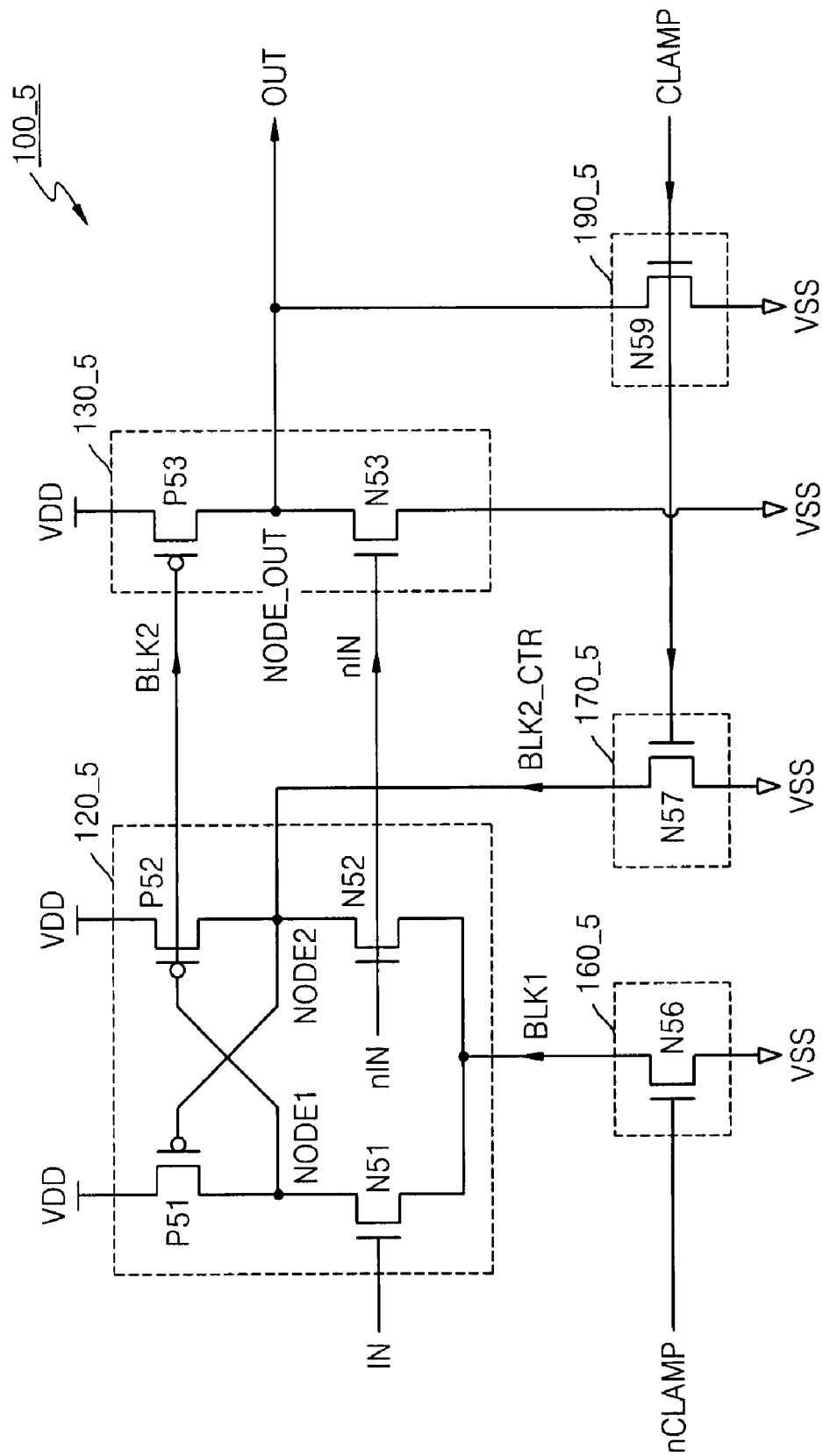
FIG. 6 is a circuit diagram of a level shifter according to another example embodiment.

FIG. 6 is a circuit diagram of a level shifter according another example embodiment.

Referring to FIG. 6, a level shifter 100_5 may have the same or substantially the same configuration and/or operation as the level shifter 100_4 described above, except that the first current blocking unit 160_5 may be connected to a first PMOS transistor P51, a first NMOS transistor N51, a second PMOS transistor P52 and a second NMOS transistor N52. In this example, the first current blocking unit 160_5 may include an NMOS transistor N56, which may be connected directly to second terminals of both NMOS transistor N51 and NMOS transistor N52. A detailed description of the remaining components and operation of the level shifter. 100_5 is omitted for the sake of brevity because the level shifter 100_5 has the same or substantially the same configuration and/or operation as the level shifter 100_4.

Figure 7:
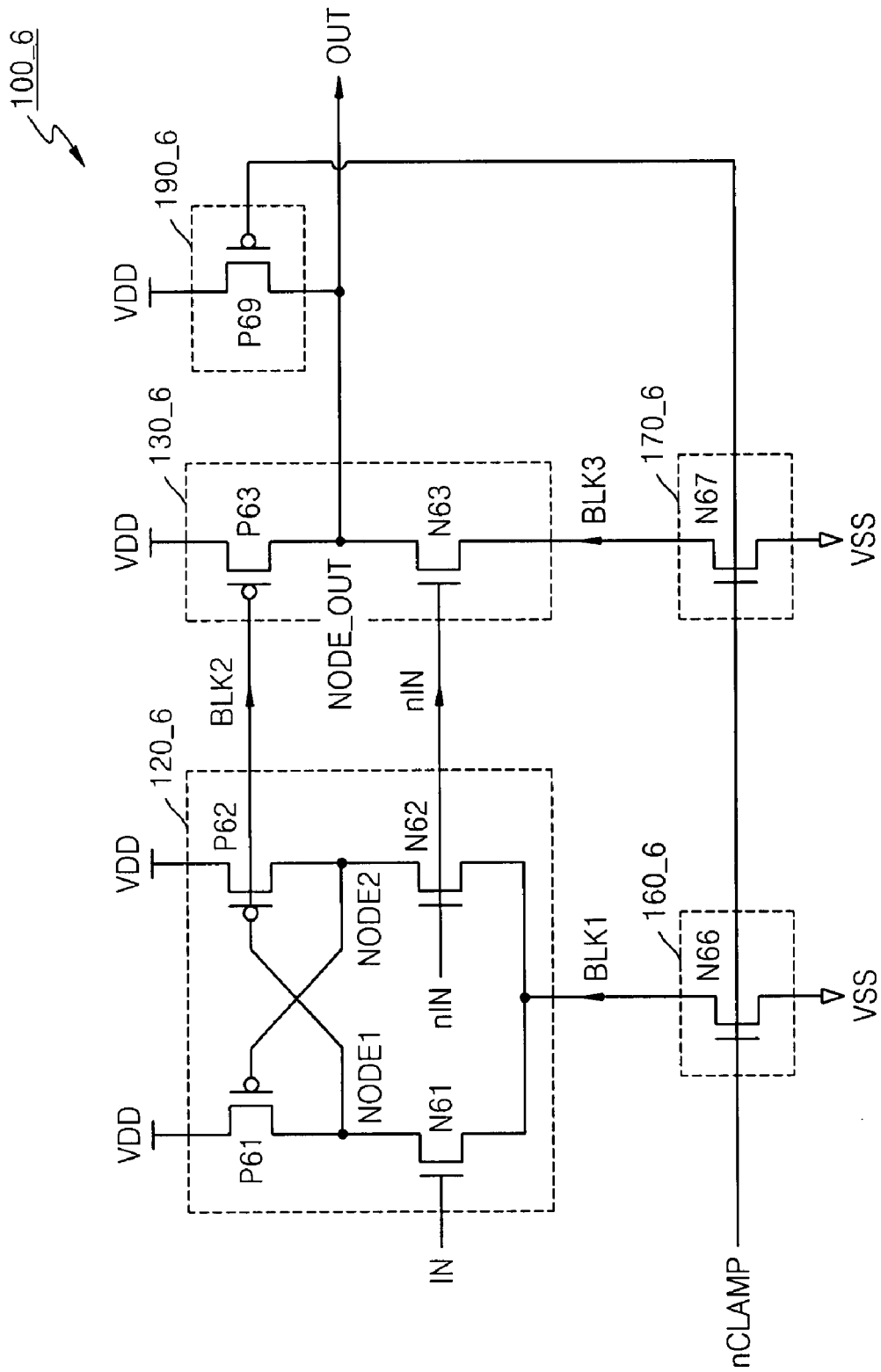
FIG. 7 is a circuit diagram of a level shifter according to another example embodiment.

FIG. 7 is a circuit diagram of a level shifter according to yet another example embodiment.

Referring to FIG. 7, a level shifter 100_6 may have the same or substantially the same configuration and/or operation as the level shifter 100_1 described above, except the second current blocking unit 170_6 and an output control unit 190_6 may be arranged in a different manner. Therefore, only the second current blocking unit 170_6 and the output control unit 190_6 will be described for the sake of brevity.

The second current blocking unit 170_6 may include a fifth NMOS transistor N67. The fifth NMOS transistor N67 may have a gate receiving the inversion mode selection signal nCLAMP, a first terminal connected to the second terminal of the NMOS transistor N63, and a second terminal connected to ground voltage VSS. The output control unit 190_6 may include fourth PMOS transistor P69. The fourth PMOS transistor P69 may have a gate receiving the inversion mode selection signal nCLAMP, a first terminal connected to power supply voltage VDD and a second terminal connected to node NODE_OUT.

In the input blocking mode, the fifth NMOS transistor N67 may be turned off in response to the inversion mode selection signal nCLAMP with a logic low level. When the fifth NMOS transistor N67 is turned off, current passing between a third PMOS transistor P63 and a third NMOS transistor N63 may be suppressed and/or blocked. Thus, in the input blocking mode, the current may not flow through a level shifting unit 130_6.

In the input blocking mode, the fourth PMOS transistor P69 may be turned on in response to an inversion mode selection signal nCLAMP with a logic low level. When the fourth PMOS transistor P69 is turned on, an output node NODE_OUT may be connected to a fourth power supply voltage VDD. Thus, in the input blocking mode, the output signal OUT with the voltage level of the fourth power supply voltage VDD, for example, a logic high level, may be output regardless of the levels of the input signals IN and nIN.

Figure 8:
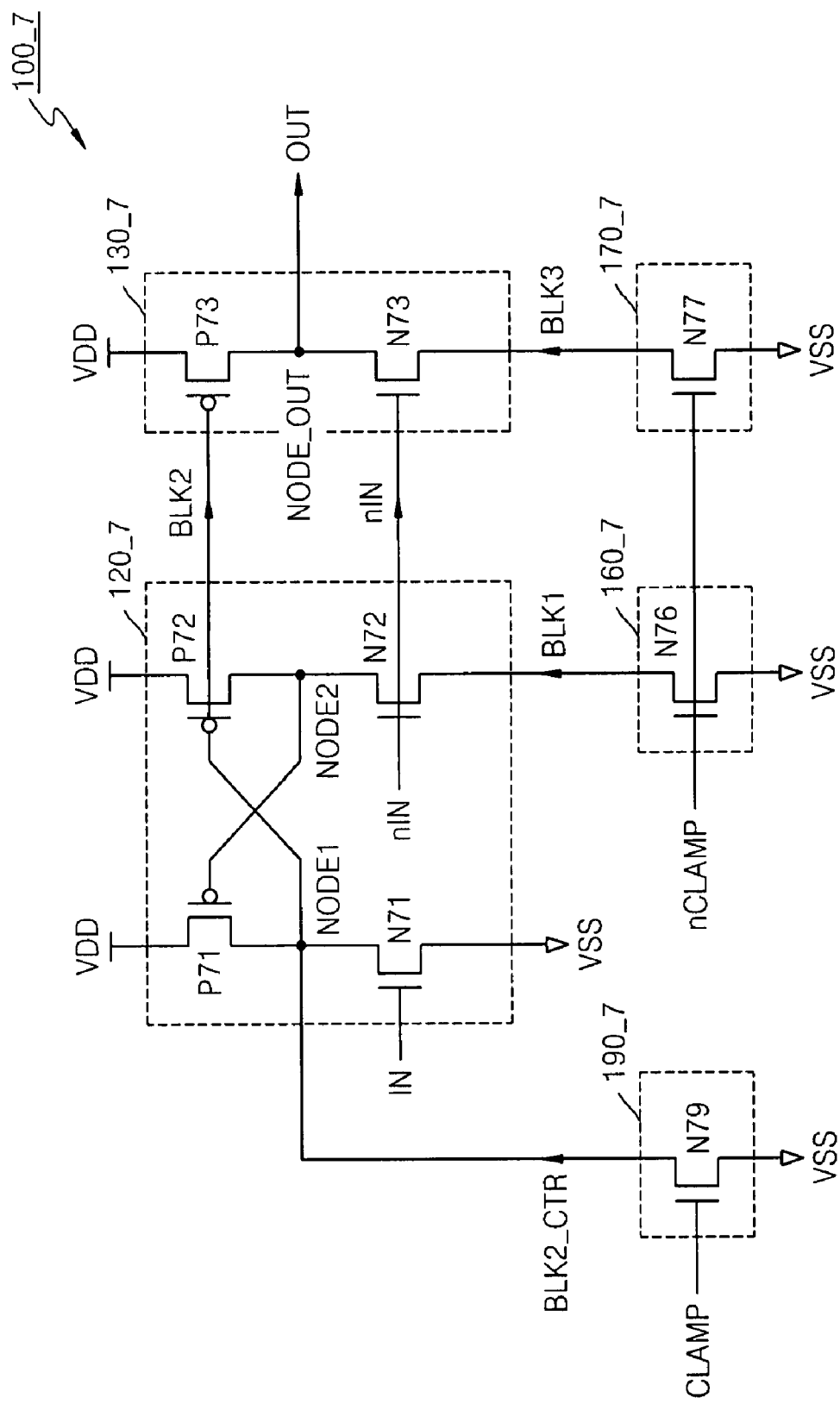
FIG. 8 is a circuit diagram of a level shifter according to another example embodiment.

FIG. 8 is a circuit diagram of a level shifter according to another example embodiment.

Referring to FIG. 8, a level shifter 100_7 may have the same or substantially the same configuration and/or operation as the level shifter 100_6 described above, except that the first current blocking unit 160_7 may not be connected to a first PMOS transistor P71 and a first NMOS transistor N71, and an output control unit 190_7 may include an NMOS transistor. Therefore, the configuration and the operations of the level shifter 100_7 will be described focusing on differences with the level shifter 100_6 for the sake of brevity.

The output control unit 190_7 may include a fifth NMOS transistor N79. In the input blocking mode, the fifth NMOS transistor N79 may be turned on in response to the mode selection signal CLAMP with a logic high level. When the fifth NMOS transistor N79 is turned on, a first node NODE1 may have a level of the ground voltage VSS, for example, a logic low level. When the first node NODE1 has a logic low level, a third PMOS transistor P73 of a level shifting unit 130_7 may be turned on and an output node NODE_OUT may be connected to a third power supply voltage VDD. Therefore, in the input blocking mode, an output signal OUT with the voltage level of the third power supply voltage VDD, for example, a logic high level, may be output regardless of the levels of the input signals IN and nIN.

FIG. 9 is a flowchart illustrating a level shifting method according to an example embodiment. The method of FIG. 9 may suppress and/or prevent current flow, while generating fixed, desired or given output values in an input blocking mode.

Referring to FIG. 9, according to the level shifting method 900, an input signal may be received from a given function block, the voltage levels of the input signal may be changed and the input signal may be output as an output signal. The level shifting method 900 may include suppressing and/or blocking the current flowing to a level shifting circuit in the input blocking mode where the power supplied to the function block is suppressed and/or cut to deactivate the level shifting circuit, outputting the output signal of the level shifting circuit such that the output signal changes according to the input signal in a normal mode, and outputting the output signal of the level shifting circuit with a fixed, desired or given direct current (DC) voltage level in the input blocking mode. The operation of outputting the output signal with a desired or given DC voltage level may be performed by connecting an output terminal of the level shifting circuit with a given power supply voltage or ground voltage.

The level shifting method 900 may operate in accordance with any or all of the level shifters (e.g., the level shifter 100) described above. Therefore, a detailed description thereof is omitted for the sake of brevity.

As described above, in a level shifter and a level shifting method according to at least some example embodiments, an output signal with a fixed, given or desired voltage level may be output regardless of input signal received from function blocks in an input blocking mode where power supplied to the function blocks is suppressed and/or cut. Therefore, other function blocks operated using the output of the level shifter may operate normally in an input blocking mode.

Although example embodiments have been described with a particular configuration, these example embodiments may be varied as desired. For example, example embodiments have been described with regard to a particular configuration of NMOS and PMOS transistors. However, NMOS and PMOS transistors may be used interchangeably in at least some example embodiments.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A level shifter comprising:
   a level shifting circuit configured to generate an output signal by changing a voltage level of an input signal received from a function block;
   a current suppression circuit configured to deactivate the level shifting circuit in response to a mode selection signal; and
   an output control circuit configured to control the output signal from the level shifting circuit to have a first direct current (DC) voltage level, wherein
   the level shifting circuit includes,
      a latching circuit configured to receive, latch and output the input signal, and
      a level shifting unit configured to change the voltage level of the output signal of the latching circuit and output the changed signal as the output signal, and
   the current suppression circuit includes,
      a first current suppression unit configured to suppress current flowing to the latching circuit in response to the mode selection signal, and
      a second current suppression unit configured to suppress current flowing to the level shifting circuit in response to the mode selection signal.

2. The level shifter of claim 1, wherein the current suppression circuit deactivates the level shifting circuit by suppressing current flowing to the level shifting circuit in an input suppression mode in which power supplied to the function block is cut, and
   the output control circuit controls the output signal from the level shifting circuit to have a first direct current (DC) voltage level in the input suppression mode.

3. The level shifter of claim 2, wherein the output control circuit connects the output terminal of the level shifting circuit to a power supply voltage or ground voltage in the input suppression mode.

4. The level shifter of claim 2, wherein the output control circuit includes,
   a gate configured to receive a mode selection signal,
   a first terminal connected to an output terminal of the level shifting circuit, and
   a second terminal connected to a first voltage, and wherein
      in the input suppression mode, the output control circuit connects the output terminal of the level shifting circuit with the first voltage in response to the mode selection signal, the first voltage being one of a power supply voltage or a ground voltage.

5. The level shifter of claim 4, wherein the output control circuit is an MOS transistor.

6. The level shifter of claim 2, wherein the mode selection signal is indicative of one of a normal mode and the input suppression mode, and the output signal is generated according to the mode selection signal.

7. The level shifter of claim 2, wherein,
   the first current suppression circuit is configured to suppress current flowing to the latching circuit in the input suppression mode, and
   the second current suppression circuit is configured to suppress current flowing to the level shifting circuit in the input suppression mode.

8. The level shifter of claim 7, wherein the first current suppression circuit includes,
   a gate configured to receive an inversion mode selection signal generated by inverting the mode selection signal,
   a first terminal connected to the latching circuit, and
   a second terminal connected to a ground terminal, and wherein
      in the input suppression mode, the first current suppression circuit stops current from flowing to the latching circuit in response to the inverted mode selection signal.

9. The level shifter of claim 8, wherein the first current suppression circuit is an MOS transistor.

10. The level shifter of claim 7, wherein the second current suppression circuit includes,
- a gate configured to receive the mode selection signal or an inversion mode selection signal generated by inverting the mode selection signal, and
- a first terminal connected to the level shifting circuit, and wherein
  - in the input suppression mode, the second current suppression circuit stops current from flowing to the level shifting circuit in response to the mode selection signal or the inversion mode selection signal.

11. The level shifter of claim 10, wherein the second current suppression circuit is a MOS transistor.

12. The level shifter of claim 7, wherein in the second current suppression circuit includes,
- a gate configured to receive the mode selection signal or an inversion mode selection signal generated by inverting the mode selection signal,
- a first terminal connected to the latching circuit, and
- a second terminal connected to a first voltage, the first voltage being one of a ground voltage or a power supply voltage, and wherein
  - in the input suppression mode, the second current suppression circuit connects the latching circuit to the first voltage response to the mode selection signal or the inversion mode selection signal.

13. The level shifter of claim 12, wherein the second current suppression circuit is a MOS transistor.

14. The level shifter of claim 2, wherein the at least one input signal include two input signals having opposite phases.

15. The level shifter of claim 1, wherein the mode selection signal is indicative of one of an input blocking mode and a normal mode, wherein
- in the input blocking mode, power supplied to the function block is cut, and
- in the normal mode, power is supplied to the function block and the level shifting circuit generates an output signal which changes according the input signal.

16. The level shifter of claim 1, wherein the latching circuit includes,
- a first transistor having a gate connected to a second node, a first terminal connected to a first power supply voltage, and a second terminal connected to a first node,
- a second transistor having a gate connected to the first node, a first terminal connected to a second power supply voltage, and a second terminal connected to the second node,
- a third transistor having a gate configured to receive the input signal and a first terminal connected to the first node, and
- a fourth transistor having a gate configured to receive an inverted input signal generated by inverting the input signal and a first terminal connected to the second node, and wherein
the level shifting circuit includes,
- a fifth transistor having a gate connected to the gate of the second transistor and a second terminal connected to an output node, and
- a sixth transistor having a gate connected to the gate of the fourth transistor and a first terminal connected to the output node.

17. The level shifter of claim 16, wherein the first current suppression circuit includes,
- a seventh transistor in which a gate is configured to receive an inversion mode selection signal generated by inverting the mode selection signal, a first terminal is connected to the second terminal of the third transistor and the second terminal of the fourth transistor, and a second terminal is connected to a ground voltage, wherein
the output control circuit includes,
- an eighth transistor in which a gate is configured to receive the mode selection signal, a first terminal is connected to the output node, and a second terminal is connected to a ground voltage, wherein
the second current suppression circuit includes a ninth transistor in which a gate is configured to receive the mode selection signal, a first terminal is connected to a third power supply voltage, and a second terminal is connected to the first terminal of the fifth transistor, and
the ninth transistor suppresses the current passing between the fifth and sixth transistor in response to the mode selection signal.

18. The level shifter of claim 16, wherein the first current suppression circuit includes,
- a seventh transistor in which a gate is configured to receive an inversion mode selection signal generated by inverting the mode selection signal, a first terminal is connected to the second terminal of the third transistor and the second terminal of the fourth transistor, and a second terminal is connected to a ground voltage,
the output control circuit includes,
- an eighth transistor in which a gate is configured to receive the mode selection signal, a first terminal is connected to the output node, and a second terminal is connected to a ground voltage, and
the second current suppression circuit includes,
- a ninth transistor in which a gate is configured to receive the inversion mode selection signal, a first terminal is connected to a fourth power supply voltage, and a second terminal is connected to the first node, wherein
  - the ninth transistor turns on in response to the inversion mode signal such that the first node has the voltage level of the fourth power supply voltage.

19. The level shifter of claim 16, wherein the first current suppression circuit includes,
- a seventh transistor in which a gate is configured to receive an inversion mode selection signal generated by inverting the mode selection signal, a first terminal is connected to the second terminal of the third transistor, and a second terminal is connected to a ground voltage,
the output control circuit includes,
- an eighth transistor in which a gate is configured to receive the mode selection signal, a first terminal is connected to the output node, and a second terminal is connected to a ground voltage, and
the second current suppression circuit includes,
- a ninth transistor in which a gate is configured to receive the inversion mode selection signal, a first terminal is connected to the fourth power supply voltage, and a second terminal is connected to the first node, wherein
  - the ninth transistor turns on in response to the inversion mode selection signal such that the first node has the voltage level of the fourth power supply voltage.

20. The level shifter of claim 16, wherein the first current suppression circuit includes,
- a seventh transistor in which a gate is configured to receive an inversion mode selection signal generated by inverting the mode selection signal, a first terminal is connected to the second terminal of the third transistor, and a second terminal is connected to a ground voltage,
the output control circuit includes, an eighth transistor in which a gate is configured to receive the mode selection signal, a first terminal is connected to the output node, and a second terminal is connected to a ground voltage, and the second current suppression circuit includes, a tenth transistor in which a gate is configured to receive the mode selection signal, a first terminal is connected to the second node, and a second terminal is connected to a ground voltage, wherein the tenth transistor turns on in response to the mode selection signal such that the second node has a voltage level of the ground voltage.

21. The level shifter of claim 16, wherein the first current suppression circuit includes, a seventh transistor in which a gate is configured to receive an inversion mode selection signal generated by inverting the mode selection signal, a first terminal is connected to the second terminal of the third transistor and the second terminal of the fourth transistor, and a second terminal is connected to a ground voltage, the output control circuit includes, an eighth transistor in which a gate is configured to receive the mode selection signal, a first terminal is connected to the output node, and a second terminal is connected to a ground voltage, and the second current suppression circuit includes, a tenth transistor in which a gate is configured to receive the mode selection signal, a first terminal is connected to the second node, and a second terminal is connected to a ground voltage, wherein the tenth transistor turns on in response to the mode selection signal such that the second node has the voltage level of the ground voltage.

22. The level shifter of claim 16, wherein the first current suppression circuit includes, a seventh transistor in which a gate is configured to receive an inversion mode selection signal generated by inverting the mode selection signal, a first terminal is connected to the second terminal of the third transistor and the second terminal of the fourth transistor, and a second terminal is connected to a ground voltage, the output control circuit includes, a ninth transistor in which a gate is configured to receive the mode selection signal, a first terminal is connected to the fourth power supply voltage, and a second terminal is connected to the output node, and the second current suppression circuit includes, an eighth transistor in which a gate is configured to receive an inversion mode selection signal generated by inverting the mode selection signal, a first terminal is connected to the second terminal of the sixth transistor, and a second terminal is connected to a ground voltage, wherein the eighth transistor turns off in response to the inversion mode selection signal such that the current passing between the fifth transistor and the sixth transistor is suppressed.

23. The level shifter of claim 16, wherein the first current suppression circuit includes, a seventh transistor in which a gate is configured to receive an inversion mode selection signal generated by inverting the mode selection signal, a first terminal is connected to the second terminal of the third transistor, and a second terminal is connected to a ground voltage, the output control circuit includes, an eighth transistor in which a gate is configured to receive the mode selection signal, a first terminal is connected to the first node, and a second terminal is connected to a ground voltage, wherein the eighth transistor turns on in response to the mode selection signal such that the first node has the voltage level of the ground voltage, and the second current suppression circuit includes, a tenth transistor in which a gate is configured to receive the inversion mode selection signal, a first terminal is connected to the second terminal of the sixth transistor, and a second terminal is connected to a ground voltage, wherein the tenth transistor turns off in response to the inversion mode selection signal such that the current passing between the fifth transistor and the sixth transistor is suppressed.

24. A level shifting method comprising:

deactivating a level shifting circuit by suppressing current flowing to the level shifting circuit in an input suppression mode in which power supplied to a function block is cut; and outputting an output signal from the level shifting circuit, the output signal changing according to the input signal in a normal mode, and having a first direct current (DC) voltage level in the input suppression mode, wherein the level shifting circuit includes,
latching the input signal at a latching circuit, and
changing the voltage level of an output signal of the latching circuit and outputting the changed signal as the output signal at a level shifting unit, and deactivating the level shifting circuit includes,
first suppressing current flowing to the latching circuit in response in the input suppression mode, and
second suppressing current flowing to the level shifting circuit in the input suppression mode.

25. The method of claim 24, wherein the output signal is output with a first DC voltage level by connecting an output terminal of the level shifting circuit with one of a power supply voltage and a ground voltage.

* * * * *